United States Patent
Bonet

(10) Patent No.: US 7,156,283 B2
(45) Date of Patent: Jan. 2, 2007

(54) METHOD FOR MAKING A SOLDER BETWEEN METALLIC BALLS OF AN ELECTRONIC COMPONENT AND MOUNTING LANDS OF A CIRCUIT AND SOLDERING FURNACE THEREFOR

(75) Inventor: Claude Bonet, Paris (FR)

(73) Assignee: L'Air Liquide, Societe Anonyme a Directoire et Conseil de Surveillance pour l'Etude et l'Exploitation des Procedes Georges Claude, Paris (FR)

( * ) Notice: Subject to any disclaimer, the term of this patent is extended or adjusted under 35 U.S.C. 154(b) by 474 days.

(21) Appl. No.: 10/450,374

(22) PCT Filed: Dec. 10, 2001

(86) PCT No.: PCT/FR01/03898

§ 371 (c)(1),
(2), (4) Date: Jun. 10, 2003

(87) PCT Pub. No.: WO02/49401

PCT Pub. Date: Jun. 20, 2002

(65) Prior Publication Data

US 2004/0045642 A1 Mar. 11, 2004

(30) Foreign Application Priority Data

Dec. 11, 2000 (FR) .................................. 00 16061

(51) Int. Cl.
*B23K 31/02* (2006.01)
(52) U.S. Cl. ............................................. 228/180.22
(58) Field of Classification Search ........... 228/180.22, 228/210, 234.1, 200
See application file for complete search history.

(56) References Cited

U.S. PATENT DOCUMENTS

| | | | |
|---|---|---|---|
| 4,117,968 A * | 10/1978 | Naidich et al. .......... | 228/124.1 |
| 5,222,649 A | 6/1993 | Funari et al. | |
| 5,232,145 A | 8/1993 | Alley et al. | |
| 5,249,100 A * | 9/1993 | Satoh et al. ................. | 361/689 |
| 5,333,774 A | 8/1994 | Mishina et al. | |
| 5,757,071 A * | 5/1998 | Bhansali ..................... | 257/697 |
| 5,918,795 A * | 7/1999 | Yamaguchi et al. ........ | 228/200 |
| 6,204,490 B1 | 3/2001 | Soga et al. | |
| 6,231,691 B1 * | 5/2001 | Anderson et al. ........... | 148/400 |
| 6,371,361 B1 * | 4/2002 | Yamaguchi et al. ........ | 228/200 |
| 6,376,054 B1 * | 4/2002 | Langenthal et al. ........ | 428/210 |
| 6,413,620 B1 * | 7/2002 | Kimura et al. .............. | 428/210 |
| 6,444,489 B1 * | 9/2002 | Lin ............................. | 438/107 |
| 6,575,352 B1 * | 6/2003 | Takahashi et al. .......... | 228/223 |
| 6,805,974 B1 * | 10/2004 | Choi et al. .................. | 428/646 |

FOREIGN PATENT DOCUMENTS

DE 199 25 652 1/2000

OTHER PUBLICATIONS

International Search Report for PCT/FR01/03898, no date avail.
Patent Abstracts of Japan; vol. 1997, No. 01, Jan. 31, 1997, & JP 08 236921, Matsushita Electric Ind. Co., Ltd., Sep. 13, 1996.
Patent Abstracts of Japan; vol. 1997, No. 04, Apr. 30, 1997, & JP 08 340177, Matsushita Electric Ind. Co., Ltd., Dec. 24, 1996.
Patent Abstracts of Japan; vol. 009, No. 284, Nov. 12, 1985, & JP 60 124947, Nippon Telegraph & Telephone Corp., Jul. 4, 1985.
Patent Abstracts of Japan; vol. 015, No. 244, Jun. 24, 1991, & JP 03 077772, Aiwa Co., Ltd., Apr. 3, 1991.
Patent Abstracts of Japan; vol. 1998, No. 09, Jul. 31, 1998, & JP 10 093232, Nihon Dennetsu KK, Apr. 10, 1998.

* cited by examiner

*Primary Examiner*—Jonathan Johnson
(74) *Attorney, Agent, or Firm*—Linda K. Russell; Brandon Clark

(57) ABSTRACT

A method for producing a soldered joint between the metal balls present in either a ball grid array or a chip-scale package, and the receiving pads for a circuit printed on a substrate or the receiving pads of an integrated circuit. Solder cream or an adhesive flux is deposited on the receiving pads, which then have metal balls are placed on them so as to form an assembly. The assembly is placed in an oven so as to heat the metal balls above their melting point. The balls are then cooled at a rate around 5° C./sec, so that the balls remain in their liquid state for a time period between 20 seconds to 65 seconds.

6 Claims, No Drawings

METHOD FOR MAKING A SOLDER BETWEEN METALLIC BALLS OF AN ELECTRONIC COMPONENT AND MOUNTING LANDS OF A CIRCUIT AND SOLDERING FURNACE THEREFOR

BACKGROUND

The invention relates to the mounting of electronic components. More specifically, it relates especially to the mounting of surface packages having matrix-type peripheral outputs of the BGA (ball grid array) or CSP (chip-scale package) type on printed circuits, and also of the FCOB (flip chip on board) type, as well as the assembly of these packages themselves.

These packages contain a silicon chip—an integrated circuit—and are intended to be mounted on cards which are then fitted into electronic appliances. At the present time their preferred mass application is in advance-technology GSM portable telephones. Whereas in previous-generation packages the connections to the printed circuit are provided by pads located around the periphery of a package, for example of the QFP (quad flat package) type or the like, BGA, micro-BGA or CSP packages include, for this purpose, contact elements in the form of balls of an Sn/Pb eutectic alloy containing 63% tin and 37% lead (183° C. eutectic alloy; optionally, a few per cent of silver may be added thereto). The package is assembled by reflow soldering of the balls to the printed circuit at the same time as the other components of the card.

Multilayer printed circuits usually consist of a stack of layers each having copper conducting tracks connected by interconnection vias and deposited on an insulating substrate, for example made of epoxy resin/glass fibre. The printed circuit also includes, on its external sides, copper pads for receiving the component to be soldered, each receiving pad coming into contact with a ball of the package when the latter is positioned by a positioning machine. The copper receiving pad has been coated by the circuit manufacturer with a top coat comprising a nickel sublayer 5 to 10 µm in thickness and a gold superficial film 500–1000 Å in thickness for oxidation resistance, forming a plane and solderable top surface.

It should be noted that nickel, if it has been deposited by a chemical (and therefore electroless) process contains up to 10 at % of phosphorus since this element is associated with the formulation of the nickel solution used for chemically depositing the nickel. The package is joined to the printed circuit by soldering in a reflow oven. For this purpose a spot of solder cream is deposited on the printed-circuit regions to be soldered, the spot of solder cream comprising microballs of a tin/lead alloy of the same composition as the balls of the package, a solder flux and also various organic additives, activators and texture agents. After screen-printing the solder cream and then placing the package on the printed circuit, the card is made to pass through the oven on a conveyor, in order to carry out, in a single pass, the soldering therein, according to a precise temperature/time profile, in a nitrogen atmosphere or in air. The solder cream and the alloy balls are heated in several steps with heating rates typically of about 1.2 or 3° C./s up to 220/230° C., i.e. a temperature above the eutectic temperature. The time spent in the liquid state typically varies in total between 40 s and 90 s. The maximum temperature is the reflow peak after which the cooling starts. The cooling is usually carried out at a rate which does not exceed 2° C./s, and generally is from 1 to 2° C./s. It is possible, for example, to remove hot nitrogen present in the oven and make it flow through a "cold box" which also serves to trap the vapours coming from the solder flux and is cooled by circulation of water at 10° C. This cooled nitrogen purified of flux is reinjected into the oven, at the point where the reflow peak is reached, in order to cool the card.

The soldered joint, which has therefore been produced after the soldering operation, forms a mechanical and electrical connection which is stable and durable and comprises several successive layers:

the copper of the receiving pad of the printed circuit;

a nickel layer containing phosphorus if this nickel is of chemical origin;

a layer of a tin/nickel/phosphorus intermetallic compound (having a thickness of the order of 1 µm); and the 63/37 tin/lead alloy.

Since the gold is dissolved by the tin/lead alloy during the soldering, it no longer plays any role in the process.

It should also be noted that the implantation of the tin/lead alloy balls in the BGA package itself is carried out in a very similar sequence of operations, and involving the same metallurgical operations. The bottom of the resin package has copper pads treated with a nickel/gold top coat, on each of which is placed an adhesive flux and then a ball of tin/lead alloy. The whole assembly is then put into an oven in order to reflow-solder the balls to the receiving pads.

The presence of the layer of intermetallic compound causes a problem when this is a nickel/tin/phosphorus ternary mixture as this compound exhibits brittle-type mechanical behaviour. This intrinsic brittleness makes the package/printed-circuit bond or the ball/package bond impact-sensitive, the more so as the actual geometry of the ball/chip contact region results in a stress concentration in this same contact region. A mode of fracture called brittle fracture, associated with the rapid propagation of microcracks, is therefore particularly liable to occur therein when the package or appliance into which the card is integrated is subjected to an impact. This phenomenon occurs particularly during the testing, which consists in dropping an appliance (such as a portable telephone) several times from a predetermined height (the test usually being called a "drop test").

In the case of card/package bonds, it is customary to try to remedy this problem by reinforcing the mechanical bond by injecting resin under the package at the base of the balls after soldering (called "under-filling"). This resin also has the advantage of absorbing the mechanical stresses associated with the differences in thermal expansion coefficient between the various materials of the system. However, this application requires an additional fabrication step, which complicates the fabrication of the card and increases its manufacturing cost.

SUMMARY

It is an object of the inventionto provide a method of assembling a card comprising at least one surface package having balls of the BGA or CSP type, or the like, making it possible to obtain a product of greater reliability than the known products, particularly from the standpoint of its impact strength, without thereby requiring the use of a reinforcing resin. It is another object to provide a method of assembling the balls on the package having the same reliability.

For this purpose, the subject of the invention is a method of producing a soldered joint between metal balls forming part, or intended to form part, of a BGA-type or CSP-type package or the like and receiving pads belonging to a printed circuit deposited on a substrate or to an integrated circuit contained in the said package, in which:

a solder cream or an adhesive flux is deposited on the said receiving pads;

the said balls are brought onto the said receiving pads;

the assembly is put into a reflow soldering oven so as to heat the metal balls above their melting point, characterized in that the substrate and/or package are/is forcibly cooled so as to shorten the residence time of the balls in the liquid state by subjecting the balls to a cooling rate of at least 5° C./s may be imposed on the balls.

A cooling rate of preferably between 5 and 10° C./s may be imposed on the balls.

The residence time of the balls in the liquid state during the cooling may be between 3 and 6 s approximately.

DESCRIPTION OF PREFERRED EMBODIMENTS

The total residence time of the metal balls in the liquid state may be between 20 s and 65 s.

In a preferred example of implementing the invention, the said receiving pad has a top coat consisting of nickel containing phosphorus, possibly coated with a gold film, and the metal balls are made of an alloy based on tin and lead.

Under these conditions, the metal balls and the solder cream are preferably subjected to a temperature, a residence time in the liquid state and a cooling rate such that they result in the formation, at the ball/receiving pad interface, of a tin/nickel/phosphorus intermetallic layer having a maximum thickness of 0.5 μm.

The subjects of the invention are also:

a card having at least one printed circuit deposited on a substrate and at least one integrated circuit contained in a BGA- or CSP-type package or the like, characterized in that it can be obtained by the method described above;

a package of the BGA or CSP type or the like, characterized in that it can be obtained by the method described above.

Finally, a subject of the invention is a reflow soldering oven for the assembly of cards having at least one printed circuit deposited on a substrate and at least one integrated circuit contained in a package of the BGA or CSP type or the like, or for the fabrication of such packages, characterized in that it includes, at the end of the soldering zone, means for forcibly cooling the substrate of the card and/or the package, making it possible to cool the balls at a cooling rate of at least 5° C./s.

The said forced cooling means may consist of at least one injector blasting a jet of gas onto the lower side of the substrate of the card and/or onto the package.

The oven may therefore include means for cooling the gas before it is blasted by the injector.

The said gas may be a gas or a gas mixture having a high thermal conductivity, such as hydrogen or helium.

The said forced cooling means may also consist of means for blasting a cyrogenic medium, such as a gas/liquid or gas/solid 2-phase flow, for example a suspension of liquid nitrogen droplets transported by gaseous nitrogen, or else a suspension of carbon dioxide snow transported by $CO_2$, onto the substrate of the card and/or onto the package.

The said means for blasting a gas/liquid or gas/solid 2-phase flow onto the substrate of the card and/or onto the package may comprise a nozzle or number of nozzles moving perpendicular to the card or to the package, or a fixed nozzle or number of nozzles selectively spraying the package as it moves past the said nozzle or nozzles.

The oven according to the invention preferably includes inerting means which prevent the presence of air at least in the zone where the soldering and the cooling of the soldered region take place.

The means for blasting a gas/liquid 2-phase flow are preferably connected to a source of liquid gas via a vacuum-insulated line.

If a suspension of carbon dioxide snow in gaseous $CO_2$ is used, the blasting means are preferably connected to a source of pressurized liquid $CO_2$ via an insulated line and an expansion chamber.

As will have been understood, the invention consists in adding to the conventional steps of fabricating the card or the package a step of vigorous forced cooling of the card or package carried out so that the metal balls and the mixture that they form with the solder cream or the adhesive flux during soldering, after the reflow peak has been reached, only have a short residence time in the liquid state. This vigorous forced cooling makes it possible to control the growth of the layer of intermetallic compound.

The invention will be more clearly understood on reading the following description, which details a non-limiting illustrative example of the invention. In this example, the objective is to mount a card, having a printed circuit consisting of copper tracks and receiving pads, on an FR4 (epoxy resin/ glass fibre) substrate and a surface package of the standard BGA type (having dimensions of 27 mm ×27 mm, a weight of 2.62 g, an overall thickness of 2.4 mm and having 256 balls 0.5 mm in diameter on a pitch of 1.27 mm).

As is conventional, the surface of the receiving pads of the printed circuit with 25 μm copper tracks is coated with a 5 μm nickel top coat deposited chemically. Consequently, several per cent (up to 10%) of phosphorus atoms are included in the nickel layer. A 500–1000 Å dip-coated gold layer covers the nickel and protects it from oxidation. As is also conventional, the contact elements of the package consist of balls of a tin/lead (63/37%) eutectic alloy possibly also containing a little silver (2% by mass).

According to a known operating method, deposited by screen printing on those regions of the printed circuit which are to be soldered is a solder cream based on tin and lead, the flux of which, its activators and the various organic additives are intended to help to remove the oxides and to clean those metal surfaces to be soldered which are in contact with the cream. The package is then placed on the printed circuit and the assembly thus formed is placed in the reflow soldering oven of the radiative, convective or mixed type, through which it moves between the entry and the exit of the oven at a rate of the order of 1 m/min.

Conventionally, the card passes through a first zone of the oven in which it is preheated at a rate of 0.6 to 2° C./s, which raises it to a temperature of about 150° C. Then, in a second zone of the oven, the card remains at a temperature of 150 to 180° C. for 45 to 90 s. It is during this phase that the flux fulfils its function of removing the oxides and of cleaning the surfaces to be soldered.

The actual soldering takes place in a third step, in which the tin/lead alloy balls and the solder cream coalesce when they are brought into the liquid state, at a maximum temperature of around 200–225° C. (the reflow peak). In the known processes, in which nitrogen cooled by a cold-water (10° C.) exchanger is injected into the reflow peak zone in order to achieve a cooling rate of 1 to 2° C./s, the balls remain in the liquid state for 45 to 90 s in total.

In contrast, in the process according to the invention, the residence time of the solder in the liquid state is limited by applying vigorous forced cooling to it at the end of the soldering zone of the oven, typically as soon as the reflow peak has been reached. The total residence time of the solder in the liquid state must be long enough for the gold film to have time to dissolve, so that the surface of the nickel coating can be well wetted by the tin/lead alloy and so that the tin diffuses superficially into the nickel, guaranteeing that a good soldered joint is produced thanks to the formation of the intermetallic diffusion layer.

Applying vigorous forced cooling after the reflow peak has been reached makes it possible to reduce the thickness of the layer of tin/nickel/phosphorus intermetallic compound which forms at the nickel/ball interface. Compared with the usual practice, the other characteristics of the soldered joint are preserved.

Experience shows that reducing the residence time of the tin/lead balls in the liquid state, by vigorous forced cooling, by 30–50% with respect to the usual practice, in which they are cooled at 1–2° C./s, gives good results. Compared with the usual practice described above, this means that the balls have a total residence time in the liquid state (including therefore the heating phase and the cooling phase) of 20 to 60 s approximately. In order to shorten this residence time, the balls are cooled at a cooling rate of at least 5° C./s, for example 10° C./s. It is not necessary to actually quench the metal (for which the cooling rate would be very high), but to apply more vigorous controlled forced cooling than is usually practised. The liquid state is therefore maintained for approximately 3 to 6 s during cooling, whereas this time is usually around 30 s. In this way, the aim is to obtain a maximum thickness of 0.5 µm for the layer of tin-nickel-phosphorus intermetallic compound, compared with the thickness of about 1 µm usually obtained.

To obtain the desired cooling rates, it is estimated that the cooling means must be capable of carrying out heat exchange with the card and/or the package characterized by a flux density of at least 1 W/cm$^2$ and up to 3 W/cm$^2$.

Direct measurements or estimates of the temperature of the zones to be cooled may advantageously be made using thermocouples or optical pyrometers. It is thus possible to check, during operation of the oven, that the settings for the various operating parameters do allow the necessary cooling rate to be obtained.

EXAMPLES

To obtain this controlled cooling, several examples of solutions may be proposed.

In a first example, a gas such as nitrogen is blasted at a high flow rate onto the card and/or onto the package. This gas may have been cooled beforehand, either in a 10° C. water exchanger or in a liquid-nitrogen exchanger which gives a cold gas, for example at approximately −100° C. This blasting may be carried out by means of one or more "injectors", that is to say blasting elements which are provided with one or more slots or cylindrical orifices via which the gas is expelled, and which are oriented towards the zone or zones to be cooled. Although blasting with gas onto the lower side of the card may, in certain cases, be sufficient to obtain the desired result, a higher cooling rate is obtained in the soldering zone if the gas is blasted directly onto the package. Of course, these two cooling methods may be combined in order to obtain, if necessary, more rapid cooling. By way of example, a gaseous nitrogen flow rate of 15 Sm$^3$/h may be used for an injection carried out over a width of 0.30 m.

In a second example, the above operating method can be improved by using a gas having a high thermal conductivity, such as hydrogen or helium, in the pure state or a mixture of such gases. Whereas with more common gases, such as nitrogen, the heat transfer between the gas and the soldering zone takes place essentially by convection, in this second example the contribution made by conduction in the heat transfer becomes significant and it is possible to achieve more rapid cooling if necessary. Here again, by way of example, a hydrogen or helium flow rate of 50 Sm$^3$/h for an injection width of 0.30 m may be proposed. The hydrogen and helium may be used in a closed circuit, provided that they are partially purified of the nitrogen which has contaminated them before they are reinjected into the oven.

These two examples can be used in cases where achieving a sufficient cooling rate does not mean that the gas is blasted at an exaggeratedly high rate to the point that there is the risk of tearing of the package due to the effect of the gas thrust or tearing of the small components called "chips" which, because they are both very small in size and in mass compared with the BGA package, may be torn from the card or displaced if the gas blast is too violent.

In a third example, the soldering zone is cooled by blasting, over the entire width of the upper side of the card, a gas/liquid 2-phase flow (for example a suspension of liquid nitrogen droplets transported by gaseous nitrogen in a proportion of 90% liquid/10% gas by mass) or a gas/solid 2-phase flow (for example a suspension of carbon dioxide snow in gaseous $CO_2$, in a proportion of 55% snow/45% gas by mass) by means of a nozzle or a number of nozzles moving perpendicular to the card. In the latter arrangement, flat-jet nozzles placed side by side, which effectively spray the entire moving card, will be preferred. The desired cooling may, by way of example, be obtained using a liquid nitrogen flow rate of 0.2 l/h and per nozzle.

In another variant of this example, a fixed nozzle or number of nozzles are used, which selectively blasts the 2-phase flow onto the package at the moment that it moves past the nozzle or nozzles. The geometry of the nozzle or number of nozzles depends on the size of the package.

The spraying of the upper side of the card or the spraying of the package may be replaced or supplemented with spraying of the lower side of the substrate of the card.

Compared with the previous operating methods, this method has the advantage of running no risk of the package tearing. By way of example, the desired cooling may be obtained using a liquid nitrogen flow rate of 0.2 l/h for each nozzle, the number of nozzles varying according to the width of the zone to be sprayed (in particular, depending on whether it is desired to cool the entire width of the card or to selectively cool the package). The nozzle or number of nozzles is connected to the liquid nitrogen tank under a pressure of 3 bar, via a vacuum-insulated line, which makes it possible to minimize the losses of liquid by evaporation before it enters the oven. If a liquid $CO_2$ tank is used, an 8-bar expansion chamber is placed between the nozzle and the tank, which is under a pressure of 30 bar. The line may be insulated only by organic foam.

In all cases, it is recommended to provide means for gaseous inerting of the soldering oven, making it possible to limit or avoid the presence of oxygen inside the oven, at least in the zone where the soldering and the cooling of the soldered region take place. This is because the presence of oxygen tends to degrade the wettability of the gold-coated nickel, whereas this wettability is good in an inert atmosphere, such as pure nitrogen. The gas used for the cooling may help with this inerting.

The invention has been described within the context of application to card fabrication by means of a copper/nickel/tin/lead soldered joint using a eutectic tin/lead alloy. However, it goes without saying that it can be used to fabricate cards using other materials for their assembly, if it turns out that forced cooling according to the invention makes it possible to limit therein the formation of intermetallic compounds which, present in too large an amount, would embrittle the soldered joints. In particular, it is possible to use a non-eutectic tin/lead alloy, or even an alloy called a lead-free eutectic or non-eutectic alloy, based on tin and including one or two or three additional elements taken from the following metals, as described in the literature: silver, copper, antimony, bismuth, zinc and indium in order to form a binary, ternary or quaternary alloy.

It also goes without saying that the method can be applied to the fabrication of cards having several packages. The number and arrangement of forced cooling means will therefore be adapted accordingly. For example, with regard to a card furnished with BGA packages on both sides, it will be advantageous to use the invention on the first side only and then on both sides simultaneously in order to prevent the BGA package already soldered from being subjected a second time to reflow during the second pass.

Finally, the method can be adapted to the operation of fabricating packages with balls, of the BGA type or the like, during which the balls are fixed to the receiving pads of the package by soldering. The conditions required to obtain good quality bonding between the balls and the receiving pads are the same and for the same reasons, namely to obtain a thin layer of intermetallic compound at the ball/receiving pad interface.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A method which may be used for producing a soldered joint between metal balls, wherein the metal balls form part of a ball grid array (BGA) or a chip-scale package (CSP), and between receiving pads for a circuit printed on a substrate or receiving pads on an integrated circuit contained on the chip-scale package, said method comprising:
    a) depositing a solder cream or an adhesive flux on receiving pad, wherein said receiving pads comprise at least one member selected from the group consisting of:
        1) receiving pads for a circuit printed on a substrate; and
        2) receiving pads on an integrated circuit contained on a chip-scale package;
    b) placing metal balls onto said receiving pad to form an assembly;
    c) heating said metal balls above their melting point by placing said assembly into a reflow soldering oven, wherein the total residence time said balls remain in the liquid state is between about 20 sec to about 65 sec; and
    d) cooling said metal balls; wherein said cooling comprises subjecting said metal balls to a cooling rate of at least about 5° C./sec.

2. The method according to claim 1, whereby cooling is forcibly imposed.

3. The method according to claim 1, wherein the cooling rate imposed on said metal balls is about 50° C./s to about 100° C./s.

4. The method according to claim 1, wherein said metal balls remain in a liquid state during the cooling for an amount of time from about 3 sec to about 6 sec.

5. The method according to claim 1, wherein said metal balls consist of an alloy comprised of tin and lead.

6. The method according to claim 5, wherein said metal balls and either the solder cream or the adhesive flux further comprise the formation of a metallic layer consisting of tin, nickel, and phosphorus with a maximum thickness of about 0.5 μm at the interlace of the ball and the receiving pad forms.

* * * * *

UNITED STATES PATENT AND TRADEMARK OFFICE
CERTIFICATE OF CORRECTION

| | | |
|---|---|---|
| PATENT NO. | : 7,156,283 B2 | Page 1 of 1 |
| APPLICATION NO. | : 10/450374 | |
| DATED | : January 2, 2007 | |
| INVENTOR(S) | : Claude Bonet | |

It is certified that error appears in the above-identified patent and that said Letters Patent is hereby corrected as shown below:

In Column 8, Claim 1, line 2, replace the words "50°C./s to about 100°C./s" with --5°C./s to about 10°C./s--

Signed and Sealed this

Twentieth Day of March, 2007

JON W. DUDAS
*Director of the United States Patent and Trademark Office*